United States Patent
Prinz et al.

(10) Patent No.: US 7,160,775 B2
(45) Date of Patent: Jan. 9, 2007

(54) METHOD OF DISCHARGING A SEMICONDUCTOR DEVICE

(75) Inventors: Erwin J. Prinz, Austin, TX (US); Ramachandran Muralidhar, Austin, TX (US); Rajesh A. Rao, Austin, TX (US); Michael A. Sadd, Austin, TX (US); Robert F. Steimle, Austin, TX (US); Craig T. Swift, Austin, TX (US); Bruce E. White, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 34 days.

(21) Appl. No.: 10/912,825

(22) Filed: Aug. 6, 2004

(65) Prior Publication Data

US 2006/0030105 A1     Feb. 9, 2006

(51) Int. Cl.
*H01L 21/336* (2006.01)

(52) U.S. Cl. ............... 438/257; 438/260; 438/264; 257/321; 257/317; 257/E21.422; 365/185.26

(58) Field of Classification Search ........ 438/260, 438/257, 264; 257/321, 317, E21.422
See application file for complete search history.

(56) References Cited

U.S. PATENT DOCUMENTS

| | | | |
|---|---|---|---|
| 3,805,130 A | | 4/1974 | Yamazaki |
| 3,856,587 A | | 12/1974 | Yamazaki et al. |
| 3,878,549 A | | 4/1975 | Yamazaki et al. |
| 4,943,836 A | * | 7/1990 | Mori ................ 257/323 |
| 5,824,584 A | | 10/1998 | Chen et al. |
| 5,943,571 A | * | 8/1999 | Schaefer et al. ........ 438/257 |
| 5,969,383 A | | 10/1999 | Chang et al. |
| 6,090,666 A | * | 7/2000 | Ueda et al. ........... 438/257 |
| 6,248,633 B1 | | 6/2001 | Ogura et al. |
| 6,297,095 B1 | * | 10/2001 | Muralidhar et al. ...... 438/257 |
| 6,320,784 B1 | * | 11/2001 | Muralidhar et al. ...... 365/151 |
| 6,400,610 B1 | * | 6/2002 | Sadd ................. 365/185.29 |
| 6,413,819 B1 | * | 7/2002 | Zafar et al. ........... 438/257 |
| 6,444,545 B1 | * | 9/2002 | Sadd et al. ........... 438/503 |
| 6,605,520 B1 | * | 8/2003 | Cheong ............... 438/592 |
| 6,656,792 B1 | * | 12/2003 | Choi et al. ........... 438/257 |
| 6,740,928 B1 | * | 5/2004 | Yoshii et al. .......... 257/315 |
| 6,756,292 B1 | * | 6/2004 | Lee et al. ............ 438/591 |
| 6,849,896 B1 | * | 2/2005 | Wada et al. ........... 257/315 |
| 6,912,158 B1 | * | 6/2005 | Forbes ............... 365/185.18 |
| 2002/0190343 A1 | * | 12/2002 | Jones et al. ........... 257/500 |
| 2003/0077863 A1 | * | 4/2003 | Choi et al. ........... 438/257 |
| 2004/0232478 A1 | * | 11/2004 | Kim et al. ............ 257/321 |

(Continued)

OTHER PUBLICATIONS

Chan, T. Y. et al., "A True Single-Transistor Oxide-Nitride-Oxide EEPROM Device," IEEE Electron Device Letters, vol. EDL-8, No. 3, pp. 93-95, 1987.

(Continued)

*Primary Examiner*—Bradley K. Smith
*Assistant Examiner*—Steven J. Fulk
(74) *Attorney, Agent, or Firm*—Kim-Marie Vo

(57) ABSTRACT

In one embodiment, a method for discharging a semiconductor device includes providing a semiconductor substrate, forming a hole blocking dielectric layer over the semiconductor substrate, forming nanoclusters over the hole blocking dielectric layer, forming a charge trapping layer over the nanoclusters, and applying an electric field to the nanoclusters to discharge the semiconductor device. Applying the electric field may occur while applying ultraviolet (UV) light. In one embodiment, the hole blocking dielectric layer comprises forming the hole blocking dielectric layer having a thickness greater than approximately 50 Angstroms.

11 Claims, 1 Drawing Sheet

U.S. PATENT DOCUMENTS

2005/0258470 A1* 11/2005 Lojek et al. .............. 257/315

OTHER PUBLICATIONS

Chang, Kuo Tung et al., A New SONOS Memory Using Source-Side Injection for Programming, IEEE Electron Device Letters, vol. 19, No. 7, pp. 253-255, Jul. 1998.

Rao, R.A., "Warm Carrier Programming of Si Nanocrystalline Memories", 2003 NVSM Workshop, p. 95.

Prinz, E.J. et al., "An Embedded 90nm SONOS Flash EEPROM Utilizing Hot Electron Injection Programming and 2-Sided Hot Hole Injection Erase," 2003 NVSM Workshop, p. 56.

Hradsky, Bruce, et al., "Local Charge Storage in Silicon Nanocrystal Memories", 2003 NVSM Workshop, 2pp.

* cited by examiner

METHOD OF DISCHARGING A SEMICONDUCTOR DEVICE

FIELD OF THE INVENTION

This invention relates generally to semiconductor devices, and more specifically, to nonvolatile memory devices.

BACKGROUND

Electrically erasable programmable read only memory (EEPROM) structures are commonly used in integrated circuits for nonvolatile data storage. One EEPROM device uses a silicon-oxide-nitride-oxide-silicon (SONOS) structure, in which charge is stored in the nitride layer. An advantage of the SONOS structure is the ease of processing due to its simpler layer structure.

However, it may be difficult to discharge (erase) the nitride layer of the SONOS structure. If the oxide between the silicon and nitride (i.e., bottom oxide) is too thin, direct tunneling of electrons will occur during read of the device. This tunneling is undesirable because it causes disturb problems. But if the bottom oxide is made thick enough to prevent tunneling, it is difficult to erase because holes are prevented from tunneling. While hot hole erase could be used, this process damages the bottom oxide and can lead to degraded reliability. Thus, a need exists for a process that can be used to erase SONOS devices without a concern of degraded reliability.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
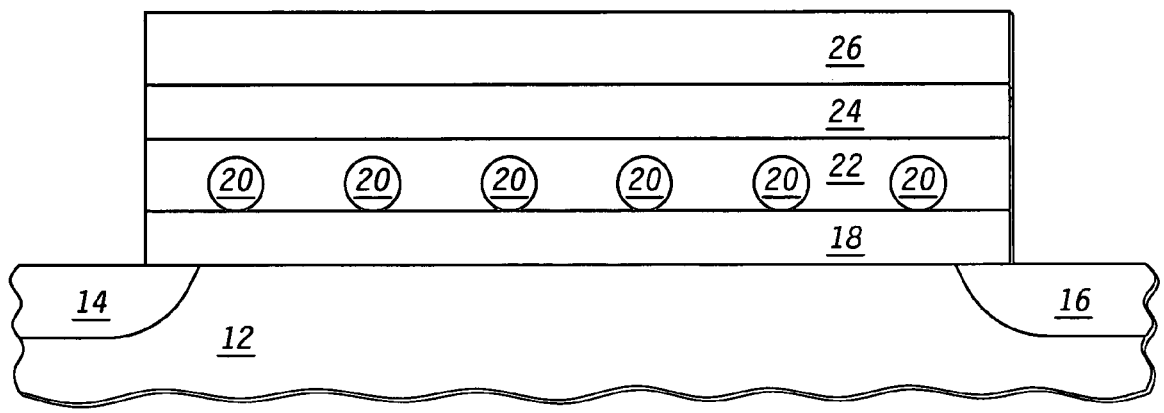
FIG. 1 illustrates a cross-section of a semiconductor device having nanoclusters over a hole blocking dielectric layer in accordance with an embodiment of the present invention.

FIG. 1 illustrates a cross-section of a semiconductor device 10, which in the embodiment shown is a MOSFET (metal-oxide-semiconductor field effect transistor). However, it is not necessary or required that the semiconductor device 10 be a MOSFET. The semiconductor device 10 includes a semiconductor substrate 12. The semiconductor substrate 12 can be any semiconductor material or a combination of semiconductor materials, such as gallium arsenide, silicon germanium, silicon carbon, silicon-on-insulator (SOI), strained silicon-on-insulator (SSOI), silicon, monocrystalline silicon, the like, and combinations of the above.

A hole blocking dielectric layer 18 is formed over the semiconductor substrate 12. In one embodiment, the hole blocking dielectric layer 18 is silicon dioxide formed by thermal growth. Alternatively, any suitable dielectric and process can be used. For example, chemical vapor deposition (CVD), physical vapor deposition (PVD), atomic layer deposition (ALD), the like and combinations of the above may be used. In one embodiment, the hole blocking dielectric layer 18 is silicon dioxide and is greater than or equal to approximately 50 Angstroms (5 nanometers). The thicker the hole blocking dielectric layer 18 the less read disturb occurs. At a thickness sufficient to reduce read disturb to acceptable levels, the layer 18 will also be too thick to allow significant cold hole tunneling during erase. The hole blocking dielectric layer 18 may not necessarily block hot holes generated by various means in the substrate layer 12. Although the hole blocking dielectric layer 18 blocks holes, it may allow electrons to tunnel through it during erase.

Nanoclusters 20 are formed over the hole blocking dielectric layer 18. The nanoclusters 20 are preferably nanocrystals of silicon, however another suitable semiconductor material or metal can be used. In addition, it is possible that the nanoclusters are amorphous. Nanoclusters 40 can be deposited through a controlled LPCVD, RTCVD or UHVCVD process. Through these processes the density of nanoclusters 20 can be closely controlled. In embodiments utilizing LPCVD or RTCVD techniques a multi-step process may be utilized to ensure proper nucleation and growth selectivity for different phases of the nanocluster formation. As such, desired nanocluster densities can be achieved while ensuring uniformity in size and density in a manufacturable process. In embodiments where UHVCVD is utilized to grow the nanoclusters 20, additional advantages are achieved due to the reduction of background contamination in the environment within which the nanocluster formation occurs. Similar optimizations to the formation of the nanoclusters that were utilized in LPCVD techniques can be employed in UHVCVD techniques to produce the desired resulting nanoclusters 20. In UHVCVD techniques, even lower pressures than those present in LPCVD techniques can provide a further reduction in growth kinetics such that a higher level control is obtained over the nanocluster formation. Furthermore, potential gradients in nanocluster growth rates due to precursor gas depletion effects are further minimized. Using any of the above methods will result in the nanoclusters that are deposited during the same process being substantially in the same plane. Preferably, the nanoclusters 20 are approximately less than approximately 100 Angstroms (10 nanometers), or more preferably are approximately 50 Angstroms (5 nanometers), in diameter. The nanoclusters 20 should not be so small so that their band gap has increased, thereby decreasing the generation rate of electron-hole pairs during erase. As schematically shown in FIG. 1, the nanoclusters 20 are usually approximately spherical in shape since they are being formed on silicon dioxide in the embodiment illustrated. They may be a hemispherical shaped if formed on a different dielectric, such as a nitride. The density of nanoclusters 20 may be at least $10^{11}$ to $10^{12}$ nanoclusters per square centimeter.

After forming the nanoclusters 20, a charge trapping layer 22 may be formed over the nanoclusters 20. The charge trapping layer 22 stores the charge. In on embodiment, the charge trapping layer 22 is a conformal layer of silicon nitride. The charge trapping layer 22 may be any suitable material, such as any nitride, hafnium oxide, aluminum oxide, the like, and combinations of the above. If the charge trapping layer 22 is an oxide through which oxygen may diffuse, the underlying nanoclusters 20 may undesirably be oxidized and decrease the nanoclusters' 20 sizes. Thus, a passivation layer, such as a thin nitride layer, may be present between the nanoclusters 20 and the charge trapping layer 22, especially if the charge trapping layer 22 is an oxide. The charge trapping layer 22 can be formed by CVD, PVD, ALD, furnace deposition, the like or combinations of the above. In one embodiment, the charge trapping layer 22 is approximately 70 to 150 Angstroms (7 to 15 nanometers) in thickness as deposited. As will be discussed later, the thickness may decrease due to subsequent processing.

A dielectric layer 24 is formed over the charge trapping layer 22. It is desirable that the dielectric layer 24 is a high quality dielectric so that it blocks charge injected from the subsequently formed control electrode. A high quality dielectric may be silicon dioxide formed from a steam oxidation process. If the charge trapping layer 22 is silicon nitride it will serve as a barrier during this steam process and protect the underlying nanoclusters 20 from oxidation. During the steam process, the charge trapping layer 22 will be partially consumed and may have a final thickness of approximately 40 to 120 Angstroms (4 to 12 nanometers) after the steam process is completed. Any other process, such as CVD, ALD, PVD, the like and combinations of the above, or any suitable dielectric material may be used.

A control electrode 26 is formed over the dielectric layer 24. In one embodiment, the control electrode 26 is a gate electrode. The control electrode 26 may be polysilicon or a metal formed by CVD, PVD, ALD, electroplating, the like or combinations of the above. In one embodiment, the control electrode 26 is approximately 1000–1500 Angstroms (100 to 150 nanometers) of polysilicon. After forming the control electrode 26 source region 14 and drain region 16 can be formed using conventional process, such as ion implantation. Convention processing, such as formation of metal lines, may be followed to further process the semiconductor device 10. The details will not be discussed further herein.

Figure 2:
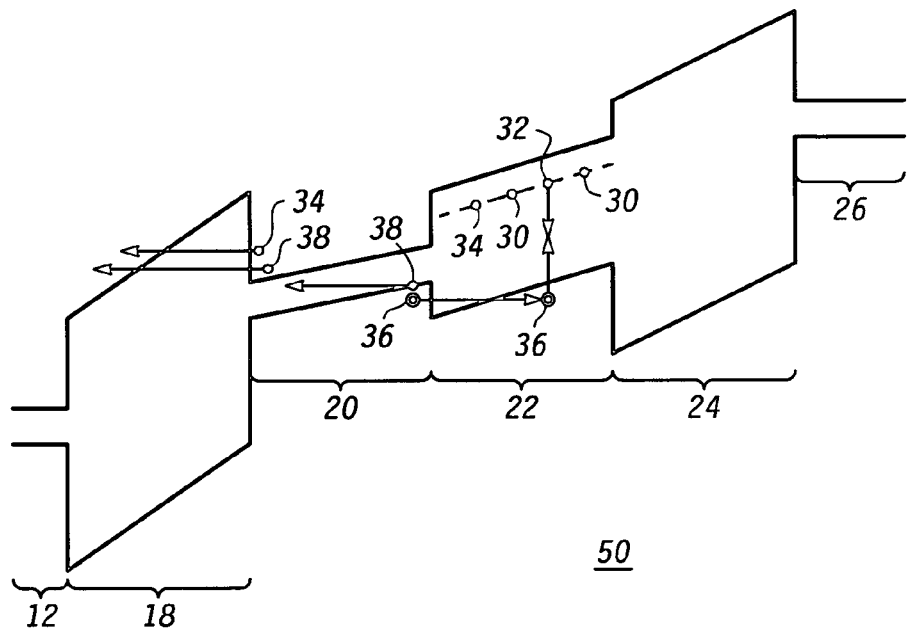
FIG. 2 illustrates a band diagram for the semiconductor device of FIG. 1 during an erase operation in accordance with an embodiment of the present invention.

FIG. 2 illustrates a band diagram 50 of the semiconductor device 10 in FIG. 1 during an erase operation. During the erase process, a negative voltage may be applied to the semiconductor device 10 resulting in the band slopes shown in FIG. 2 and the formation of an electron-hole pair 36 and 38 generated in the nanoclusters 20. In one embodiment, the negative voltage is approximately −10 V to −18 V, or more preferably approximately −14 V, which results in a field of approximately 10 to 15 MV/cm. Thus, by applying a voltage, a field is also applied. A skilled artisan should recognize that the conductivity of the charge trapping layer 22 can be modulated based on the temperature of the semiconductor device during erase. Thus, erase may be more complete at elevated temperatures. In one embodiment, the field is applied vertically and in one embodiment, the vertical field is a uniform erase.

In one embodiment, an ultraviolet (UV) light, such as a UV lamp, is used to form the electron-hole pairs in the nanoclusters 20. An electric field may be used with or without the UV light. If the electric field and the UV light are applied, the erase is deeper and the field does not have to be as high to achieve the same results as without the UV light.

The electron 38 generated by the applied field, will tunnel through the hole blocking dielectric layer 18 into the semiconductor substrate 12. The field will drive the hole 36 into the charge trapping layer 22. No additional energy is needed and hence, the hole 36 is a cold hole. Once in the charge trapping layer 22, the hole 36 will combine with an electron 32 in the charge trapping layer 22. The charge trapping layer 22 includes electrons 30, 32, and 34 stored at trap sites. The trap sites may be inherent to the material, such as those that are present in silicon nitride. When the hole 36 combines with the electron 32, the net charge in the device is more positive (i.e., less negative), and this is desirable because the more positive the device the more the device is erased.

In one embodiment, some of the electrons stored at trap sites in the charge trapping layer 22 and are close to the nanoclusters 20, such as the electron 34, may travel from the charge trapping layer 22 to the nanocluster 20, and subsequently tunnel through the hole blocking dielectric layer 18 into the semiconductor substrate 12. Since there are spaces between the nanoclusters 20, the electron 30 may not travel through the nanoclusters 20 to get to the semiconductor substrate 12. Thus, when using the semiconductor device 10 of FIG. 1 with a vertical field, the extra electrons stored at trap sites are removed when combining with a hole from the nanoclusters 20. In addition, an electron from the nanoclusters 20 tunnels through the hole blocking dielectric layer 18, but no holes tunnel through the hole blocking dielectric layer 18.

Figure 3:
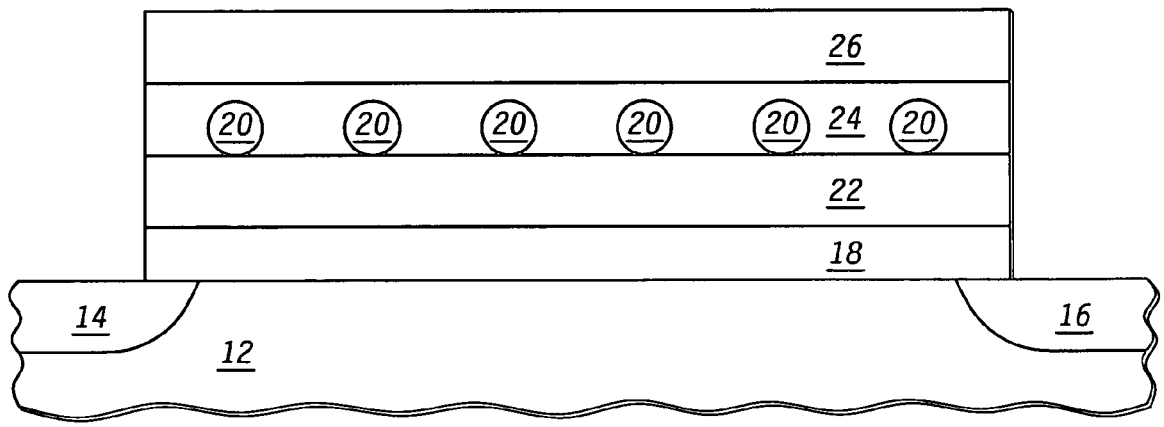
FIG. 3 illustrates a cross-section of another semiconductor device having nanoclusters over a charge storage layer in accordance with an embodiment of the present invention.

FIG. 3 illustrates a cross-section of another embodiment of a semiconductor device 60. Like element numbers indicate the same elements as in FIG. 1. The semiconductor device 60 differs from the semiconductor device 10 in that in forming the semiconductor device 10, the nanoclusters 20 are formed after the charge trapping layer 22. Hence, the nanoclusters 20 are overlying the charge trapping layer 22 and are in contact with the dielectric layer 24 in the semiconductor device 60 shown in FIG. 3. Since the nanoclusters 20 are formed over the charge trapping layer 22, the charge trapping layer 22 does not serve as a protective layer for the nanoclusters 20 during formation of the dielectric layer 24. Thus, the nanoclusters 20 may be oxidized during the formation of the dielectric layer 24. To compensate for the oxidation, the nanoclusters 20 may originally be formed larger than desired or passivated by a layer (not shown) that protects the nanoclusters 20. In one embodiment, a passivation layer, such as a nitride, is formed over the nanoclusters 20 to present or minimize the oxidation of the nanoclusters 20.

During the erase process, the semiconductor device 60 will form electron-hole pairs in the nanoclusters 20, like the device of FIG. 1. The erase is performed basically the same except that to erase the semiconductor device 60 of FIG. 3, a positive voltage may be used. In one embodiment, the positive voltage is approximately +10 V to +18 V, or more preferably approximately +14 V, which results in a field of approximately 10 to 15 MV/cm. Thus, by applying a voltage a field is also applied. A skilled artisan should recognize that the conductivity of the charge trapping layer 22 can be modulated based on the temperature of the semiconductor device during erase. Thus, erase may be more complete at elevated temperatures. In one embodiment, the field is applied vertically, and in one embodiment the vertical field is a uniform erase.

In one embodiment, an ultraviolet (UV) light, such as a UV lamp, is used to form the electron-hole pairs in the nanoclusters 20. An electric field may be used with or without the UV light. If the electric field and the UV light are applied, the erase is deeper and the field does not have to be as high to achieve the same results as without the UV light.

The electrons generated in the nanoclusters 20 by the applied field, will tunnel through the dielectric layer 24 into the control electrode 26. The field will drive the generated holes into the charge trapping layer 22; no additional energy is needed and hence, the hole 36 is a cold hole. Once in the charge trapping layer 22, the holes will combine with an electrons in the charge trapping layer 22. The charge trapping layer 22 includes electrons stored at trap sites. The trap sites may be inherent to the material, such as those that are present in silicon nitride. When the holes combine with the electrons, the net charge in the device is more positive (i.e., less negative) and this is desirable because the more positive the device the more the device is erased.

In one embodiment, some of the electrons stored at trap sites in the charge trapping layer 22, which are close to the nanoclusters 20, may travel from the charge trapping layer 22 to the nanocluster 20, and subsequently tunnel through the dielectric layer 24 into the control electrode 26. Since there are spaces between the nanoclusters 20 these electrons may not travel through the nanoclusters 20 to get to the control electrode 26.

For any device, the rate of electron-hole pair generation in the nanoclusters 20 can be increased. For example, a low band gap material, such as any material including silicon, germanium, gallium, arsenic, the like, and combinations of the above may be used to increase the electron-hole pair generation. In one embodiment, the low band gap material has a band gap less than that of silicon. These materials increase the rate of generation by reducing the barrier for electron-hole pair generation. Hence, the lower the band gap the less the barrier. In another embodiment, the rate of electron-hole pair generation is increased by introducing generation centers at the surface or in the nanoclusters 20. Two examples of introducing generation centers are damaging the surface of the nanocluster, such the ion bombardment, or forming dopants inside or on the surface of the nanoclusters 20. In addition, the rate of electron-hole pair generation can be increased by altering the density of nanoclusters 20. In one embodiment, the nanoclusters 20 cover approximately 15 to 100% of the area of the underlying layer, which may be the hole blocking dielectric layer 18 or the charge trapping layer 22. Some generations preferentially occur on the surface of the nanoclusters 20 and thus, by increasing the sum total of the surface areas of nanoclusters 20 the number of preferential generations is increased. If the coverage area is minimal (e.g., around 10%) the generation rate of electron-hole pairs is too low. If the surface coverage of the nanoclusters is approximately 100% charges may travel laterally through the nanoclusters and cause poor data retention.

To write (program) the semiconductor devices 10 and 60 any known process, such as hot carrier injection (HCI) or electron tunneling from the substrate, can be used. Since electrons are transferred during the write operation, it does not matter that the hole blocking dielectric layer 18 blocks holes but allows electrons to tunnel through it.

By now it should be appreciated that there has been provided a SONOS structure with a thick bottom oxide (the dielectric layer 18) that can be erased without the requirement of hole tunneling or hot hole injection through the dielectric layer 18. In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Although the invention has been described with respect to specific conductivity types or polarity of potentials, skilled artisans appreciate that conductivity types and polarities of potentials may be reversed. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for discharging a semiconductor device comprising:
   providing a semiconductor substrate;
   forming a hole blocking dielectric layer over the semiconductor substrate, wherein forming the hole blocking dielectric layer comprises forming the hole blocking dielectric layer having a thickness greater than approximately 50 Angstroms;
   forming nanoclusters over the hole blocking dielectric layer;
   forming a charge trapping layer over the nanoclusters; and
   applying an electric field to discharge the semiconductor device, wherein applying the electric field further comprises:
   applying the electric field to the nanoclusters to create an electron-hole pair, wherein the electron-hole pair comprises a first electron and a first hole;
   tunneling the first electron from one of the nanoclusters through the hole blocking dielectric layer into the semiconductor substrate; and
   driving the first hole from one of the nanoclusters into the charge trapping layer, wherein the charge trapping layer comprises a second electron and the first hole combines with the second electron.

2. The method of claim 1, further comprising forming a dielectric layer over the charge trapping layer.

3. The method of claim 1, wherein forming the nanoclusters comprises forming nanoclusters covering at least approximately 15 percent of an area of the hole blocking dielectric layer.

4. The method of claim 1, wherein forming the nanoclusters comprises forming the nanoclusters having an element selected from the group consisting of silicon, germanium, gallium, and arsenic.

5. The method of claim 1, wherein forming the nanoclusters comprises forming the nanoclusters comprising a material with a band gap less than that of silicon.

6. The method of claim 1, wherein forming the nanoclusters comprises implanting an element into the nanoclusters.

7. The method of claim 1, wherein applying the electric field comprises applying ultraviolet (UV) light.

8. The method of claim 1, wherein forming the hole blocking dielectric layer comprises forming the hole blocking dielectric layer, wherein the hole blocking dielectric layer comprises an electron tunneling dielectric layer.

9. The method of claim 1, wherein forming the charge trapping layer over the nanoclusters, comprises forming the charge trapping layer over the nanoclusters so that the nanoclusters are within the charge trapping layer.

10. The method of claim 1, wherein applying the electrical field comprises uniformly erasing the semiconductor device.

11. The method of claim 10, wherein uniformly erasing comprises applying a voltage that has an absolute value of approximately 10 Volts to approximately 18 Volts.

* * * * *